United States Patent [19]
Haraszti

[11] Patent Number: 4,779,226
[45] Date of Patent: Oct. 18, 1988

[54] COMPLEMENTARY HIGH PERFORMANCE CAM CELL

[76] Inventor: Tegze P. Haraszti, 102 Scholz Plz., No. 238, Newport Beach, Calif. 92663

[21] Appl. No.: 946,795

[22] Filed: Dec. 29, 1986

Related U.S. Application Data

[63] Continuation-in-part of Ser. No. 732,337, May 10, 1985, abandoned.

[51] Int. Cl.⁴ .................. G11C 15/00; G11C 11/00; G11C 7/00
[52] U.S. Cl. .................. 365/49; 365/156; 365/190
[58] Field of Search .............. 365/49, 154, 156, 190

[56] References Cited

U.S. PATENT DOCUMENTS

| | | | |
|---|---|---|---|
| 3,521,242 | 5/1967 | Katz | 365/156 |
| 3,633,182 | 8/1969 | Koo | 365/49 |
| 4,112,506 | 9/1978 | Zibu | 365/181 |
| 4,660,177 | 4/1987 | O'Connor | 365/154 |

Primary Examiner—Terrell W. Fears
Assistant Examiner—Melissa J. Koval
Attorney, Agent, or Firm—Morland C. Fischer

[57] ABSTRACT

Static content addressable memory cells (CAMs) combining six transistors and two pairs of control signal lines, where both pairs of lines provide dual functions and where the content addressing function is provided by a unique combination of control and precharge signals on the four control signal lines. An alternate CAM embodiment comprising eight transistors and an additional interrogation signal line is also disclosed. The disclosed content addressable memory cells are preferably implemented by complementary metal oxide field effect transistors (CMOSFETs) and have particular application in very large scale integrated (VLSI) chips, where small cell size is of high importance and/or where high operational speed, reliability, radiation hardness and/or noise immunity, and/or operation at high temperatures and/or a large supply voltage range is required.

9 Claims, 2 Drawing Sheets

COMPLEMENTARY HIGH PERFORMANCE CAM CELL

This invention was made with Government support under Contract No. ECS-8360674 awarded by the National Science Foundation and Contract No. F04701-85-C-0075 awarded by the Air Force. The Government has certain rights in this invention.

CROSS-REFERENCE TO RELATED APPLICATIONS

This application is a continuation-in-part of application Ser. No. 732,337 filed May 10, 1985 now abandoned.

FIELD OF THE INVENTION

This invention relates to improved high performance configurations for content addressable memory (CAM) cells that are implemented from six and eight metal oxide semiconductor field effect transistor (MOSFET) devices.

PRIOR ART

As will be recognized by those skilled in the art, a conventional static complementary content addressable memory (CAM) or associative memory cell may be fabricated from ten ratio (transistor) devices. Such a CAM is illustrated at FIG. 1 of the drawings. In general terms, a CAM is a storage medium that can be accessed by searching for data content stored therewithin. A CAM is addressable by associating input data (e.g. a coded search argument) with some or all of the stored words of a memory matrix. The conventional CAM cell is characterized by large size, thereby prohibiting the fabrication of large capacity CAMs on monolithic semiconductor chips, relatively medium operating speed and reliability, as well as moderate tolerance for the effects of radioactive irradiations, external noises, temperature and supply voltage variations. The eight to ten transistors which form prior art cells, the complicated internal wiring, and the requirements for aspect ratios among the constituent transistors result in uneconomical CAM sizes and limited bit capacities on a manufacturable chip, which in turn results in high costs of CAM and CAM based computing and processing systems. The large CAM cell sizes also increase the parasitic capacitances of the interrogation, data and address signal lines, as well as other control lines which result in greatly reduced operational speed of the CAM. Furthermore, the data lines of conventional CAM cells are associated with complicated small signal sense amplifiers that introduce considerable time delays to a memory array.

Because one of the access transistors of the conventional CAM cell operates in a source follower configuration, a threshold level drop in voltage occurs across the conduction path of such access transistor. Because of this threshold voltage drop and the relatively large parasitic capacitance of the data lines, the conventional CAMs operative with relatively small and slow internal voltage signals during the interrogation and read operations. An access device operating in a source follower mode also results in slower writing into the cell, since the threshold voltage drop reduces both the write voltage swing and current. The internal small signal operation also reduces the reliability and the immunity against radioactive radiations, external noises, temperature and supply voltage variations by reducing the tolerance for changes in transistor device parameters, such as threshold voltage, leakage currents, and electron and hole mobility.

SUMMARY OF THE INVENTION

In general terms, the disadvantages of the conventional static CAM cells are overcome by virtue of an improved complementary CAM cell configuration. The improved CAM configuration utilizes six or eight complementary transistor devices, a simple internal wiring scheme, has no requirement for aspect ratios among the constituent transistors, and the data lines are associated with simple large signal sense circuits. Therefore, both the CAM cell size and the CAM array size are greatly reduced, so that economical fabrication of large capacity CAM chips is possible. The improved CAM cell is accessed by a two transistor configuration, whereby to avoid a threshold level drop in voltage across the conduction path of an access transistor during interrogation, read and write. Hence, the data lines of the improved CAM cell can be driven to a full logic level swing and wide voltage range between sources of reference potential ($V_{DD}$ and $V_{SS}$) to thereby provide the associated signal lines with relatively large and fast signals. The large and fast signals eliminate the need for complicated sense amplifiers and precharge apparatus common to conventional CAMs. Moreover, the use of minimum size transistors and greatly reduced CAM cell sizes results in short interrogation, data, addressing and control signal lines. Thus, the operational speed and tolerance for transistors parameter changes are greatly improved. The improved tolerance of parameter changes also results in much higher reliability, noise immunity, radiation hardness, as well as extended temperature and supply voltage ranges.

BRIEF DESCRIPTION OF THE CONVENTIONAL CAM CELL

Figure 1:
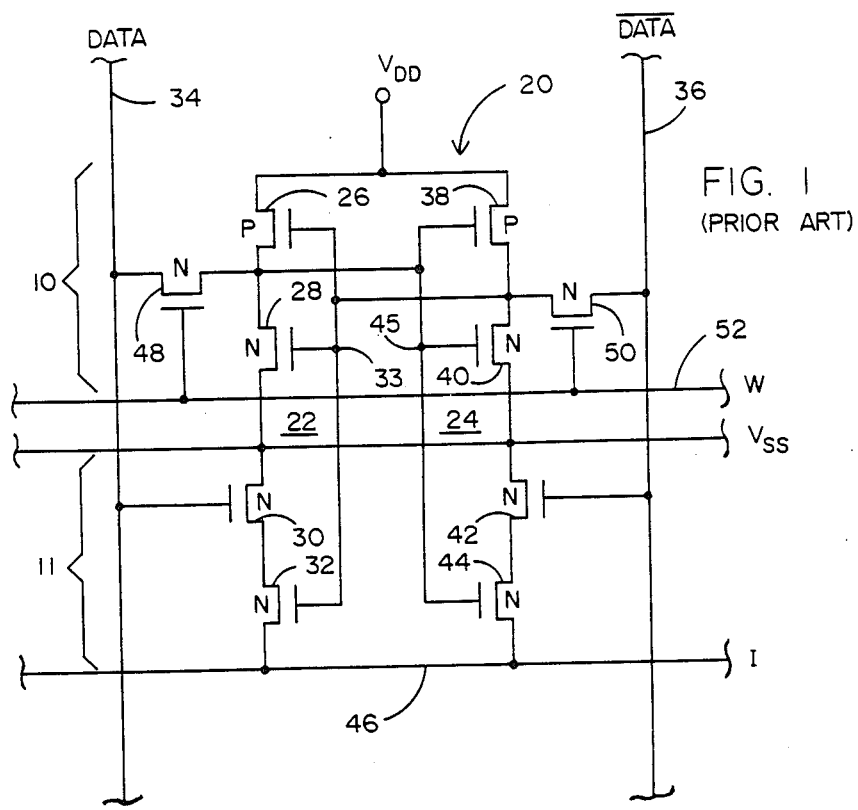
FIG. 1 illustrates a conventional static complementary CAM cell configuration.

One example of a well-known complementary content addressable memory (CAM) cell configuration 20 which employs ten transistors is described while referring to FIG. 1 of the drawings. During the following descriptions, it is to be understood that all references to a transistor actually refer to a complementary metal-oxide semiconductor field effect transistor (or CMOSFET). The well-known memory cell 20 comprises a conventional flip-flop having a pair of crosscoupled inverter stages 22 and 24 electrically connected in a positive feedback relationship with one another. Inverter 22 includes the series connection of the conduction paths of a P-channel transistor 26, an N-channel transistor 28, an N-channel transistor 30, and an N-channel transistor 32. The control electrodes of transistors 26, 28 and 32 are connected together at a common electrical conjucntion (i.e. a first data node) 33. That is, the conduction paths of transistors 26 and 28 are connected in series between sources of reference potential $V_{DD}$ and $V_{SS}$, and the conduction paths of transistors 30 and 32 are connected in series between the source of reference potential $V_{SS}$ and an interrogation line 46

(designated I). The control electrode of transistor 30 is connected to one of a pair of data lines 34 (designated DATA). Inverter 24 includes the series connection of the conduction paths of a P-channel transistor 38, an N-channel transistor 40, an N-channel transistor 42 and an N-channel transistor 44. That is, the conduction paths of transistors 38 and 40 are connected in series between the sources of reference potential $V_{DD}$ and $V_{SS}$, and the conduction paths of transistors 42 and 44 are connected in series between the source of reference potential $V_{SS}$ and interrogation line 46. The control electrodes of transistors 38, 40 and 44 are connected together at a common electrical junction (i.e. a second data node) 45. The control electrode of transistor 42 is connected to the second of the pair of data lines 36 (designated $\overline{DATA}$).

The CAM cell 20 provides interrogation capability by the transistors 30, 32, 42 and 44 which perform as a logic gate with four inputs. Data nodes 45 and 33 are accessed for reading and writing data by respective ones of a pair of identical (e.g. N-channel) access transistors 48 and 50. More particularly, the conduction path of access transistor 48 is connected between data line 34 and data node 45 (at a common electrical junction formed between the conduction paths of transistors 26 and 28). The control electrode of access transistor 48 is connected to an address or word select line 52 (designated W). The conduction path of access transistor 50 is connected between data line 36 and data node 33 (at a common electrical junction formed between the conduction paths of transistors 38 and 40). The control electrode of access transistor 50 is connected to the word select line 52.

The operation of the conventional CAM cell 20 of FIG. 1 is well-known and can be described as a combination of a complementary random access memory (RAM) cell (e.g. 10) comprising six transistors 26, 28, 38, 40, 48 and 50 and an externally activated four input logic gate 11 comprising the transistors 30, 32, 42 and 44. The logic gate 11 may be activated by precharging to a high logic level (e.g. 5 V) or by connecting a high resistivity device (e.g. a transistor or resistor) between the positive pole of the $V_{DD}$ supply and the interrogation signal line 46. Since the control electrodes of transistors 30 and 42 are connected to the DATA 34 and $\overline{DATA}$ 36 signal lines, respectively, and the control electrodes of transistors 32 and 44 are connected to the two data storage nodes of the storage cell 10, the interrogation signal line 46 can be pulled down to a low logic level only when the binary information on signal lines 34 and 36 matches the binary information stored in the storage nodes of the RAM cell 10. When a multiplicity of CAM cells 20 are connected to a single interrogation line 46 constituting a stored word of binary information, then a search argument consisting of a multiplicity of binary information can be compared with a plurality of words constituting the CAM. Therefore, only those words can be selected which completely or, by request, partially match the search argument.

The combination of a full complementary static RAM cell 10 and a logic gate 11 requires ten constituent transistors (which under special circumstances may be reduced to eight transistors) and relatively complicated internal wiring. Furthermore, the high current needed to alter the cell information through access transistors 48 and 50 during a write operation and the low current required through the same transistors 48 and 50 for a non-destructive read operation results in a design trade-off which correspondingly increase the sizes of the constituent transistors from the minimum size allowed by the semiconductor processing. The ten constituent transistor devices, the complicated internal wiring, and the aspect ratio requirements result in uneconomical CAM cell sizes and limited bit capacities for a semiconductor CAM chip. Furthermore, the increased sizes of the transistor devices as well as the increased area of the CAM cells result also in increased parasitic capacitances of the data lines 34 and 36, word line 52, and interrogation 46 signal line when a plurality of CAM cells 20 is used in an array.

During write and read, one of the access transistors 48 or 50 operates in a source follower mode as a result of the use of identical (i.e. N or P) conductivity type devices for access. In such a mode of operation, the maximum voltage which may be achieved on an associated data signal line 34 or 36 is reduced by $V_G - (V_T)$ $(V_{BG})$; where $V_G$ is the gate voltage, $V_T$ is the effective threshold voltage, and $V_{BG}$ is the back gate bias. The operation of access FET 48 or 50 in a source follower mode combined with large parasitic capacitances of the data signal lines 34 and 36 provides slower and relatively small transient signals relative to operation in a common source mode. The small signal operation also requires complicated sense amplifiers when a plurality of CAM cells are used which trades off the increased sensitivity with decreased operational speed and larger area for the sense amplifiers and other overhead circuits. The smaller voltage swings also require an accurately defined operation point in the characteristics of a sense amplifier which may easily be upset by transistor parameter changes caused by long term device instability resulting from hot carrier emmission. Thus, the reliability of the CAM is reduced. Moreover, the small signal operation and sensitivity for parameter variations reduce the immunity to radioactive radiation, external noise, temperature and supply voltage variations.

Although prior art static complementary CAM cells combined a large variety of configurations, all known CAM cells are chracterized by relatively large size and moderate operational speed, reliability, radiation hardness, noise immunity, operating temperature and supply voltage ranges.

DETAILED DESCRIPTION OF THE IMPROVED CAM CELLS

Figure 2:
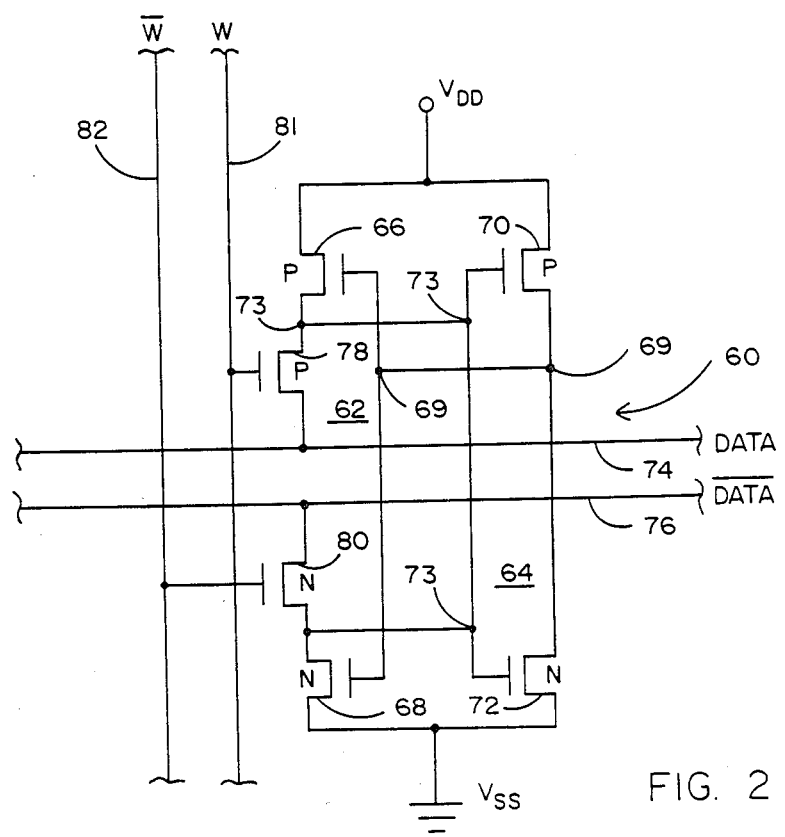
FIGS. 2-4 illustrate improved, high performance static complementary CAM cell configurations formed in accordance with the present invention.

In accordance with the present invention and referring to FIG. 2 of the drawings, the configuration for a first improved complementary memory cell 60 which is adapted for CAM operation and is implemented by conventional MOSFET devices is now disclosed. Improved memory cell 60 comprises a flip-flop having two cross-coupled inverters 62 and 64 electrically interconnected in a positive feedback relationship with one another between sources of reference potential $V_{DD}$ (typically +5 volts DC) and $V_{SS}$ (typically ground). Inasmuch as the cross-coupled inverters 62 and 64 are similar in configuration to the cross-coupled inverters of a conventional RAM cell, only a brief description of such inverters 62 and 64 will be given. Inverter 62 includes series connected P and N-channel FETs 66 and 68. The control electrodes of transistors 66 and 68 are connected together at a common electrical junction 69 with the conduction path of inverter 64. Inverter 64 also includes series connected P and N-channel FETs 70 and 72. The control electrodes of transistors 70 and 72 are connected together at a common electrical junction (i.e. a data node) 73 with the conduction path of inverter 62.

Memory cell 60 includes a pair of data lines 74 (designated DATA) and 76 (designated $\overline{\text{DATA}}$). Accordingly, one of a pair of opposite conductivity type P and N-channel access transistors 78 and 80 is respectively connected between data node 73 and each of data lines 74 and 76 to selectively control the read/write access to the memory cell 60. More particularly, the control electrodes of access transistors 78 and 80 are connected to respective ones of a pair of address or word select lines 81 and 82 (designated W and $\overline{\text{W}}$). The conduction path of access transistors 78 is connected between data line 74 and data node 73 (at a common electrical junction formed with one conduction electrode of inverter transistor 66). The conduction path of access transistor 80 is connected between data line 76 and data node 73 (at a common electrical junction formed with one conduction path electrode of inverter transistor 68).

The address lines 81 and 82 perform the dual function of selectively addressing memory cell 60 as well as interrogating the memory cell 60 to compare the data content stored at data node 73 with a coded external search argument. The data signal lines 74 and 76 perform the dual function of supplying input and output data and serving as interrogation output (i.e. flag) lines. Thus, the interrogation line (designated 46 in the prior art CAM cell of FIG. 1) is eliminated in the improved CAM configuration of FIG. 2.

The unique feature of the six transistor memory cell 60 is its ability to be accessed by data content rather than by address in an associative search or interrogation mode. That is, address lines (i.e. associative search lines) 81 and 82 are provided with identical potentials and supply either the logical 0 or 1 signal levels which are representative of the external search argument to be compared with the data stored in memory cell 60. In the event that data line 74 is charged to a logic level 0 and data line 76 to a logic level 1, a current will conduct either on data line 74 or on data line 76 whenever a mismatch occurs between the logical signal levels to which address lines 81 and 82 are simultaneously charged and the logical signal level stored in memory cell 60 at data node 73. In the event that data line 74 is charged to a logic level 1 and data line 76 to a logic level 0, a current will cunduct on either data line 74 or on 76 whenever a match occurs between the logical signal levels to which lines 81 and 82 are simultaneously charged and the logical signal level stored at data node 73. The resulting match or mismatch may be detected by interfacing one of the data lines with an inverter (not shown), and then utilizing both lines 74 and 76 as inputs to a NOR or NAND gate (also not shown). Of course, the word select lines 81 and 82 are also used during the read/write operations of CAM cell 60 during RAM operation.

For a read operation, both access transistors 78 and 80 must be simultaneously turned on by providing a low logic level signal on address line 81 and a high logic level signal on address line 82. However, for a write operation, both DATA and $\overline{\text{DATA}}$ signal lines 74 and 76 must have either identical low or high logic level signals, while for a read operation, preferably one of the data signal lines 74 or 76 is at a low level and the other one is at a high level, as described for the interrogation mode. Moreover, interrogation and read operations may be performed by providing intermediate voltage levels on signal lines 74 and 76. In the preferred interrogation and read modes of operation, when data signal lines 74 and 76 are precharged high and low, respectively, only one of the two access transistors 78 or 80 will be conductive. While in the write mode, both access transistors 78 and 80 are conductive. Thus, the resulting conductivity for a write operation is considerably larger than that in the interrogation or read modes. Therefore, the high current required for write and the low current required for non-destructive interrogation and read are inherently provided by the CAM cell 60. Conversely, no different aspect ratios for the constituent transistors are required, and, so, six identical minimum size transistor devices can be used to implement the improved CAM cell 60.

The combination of low transistor device count, the relatively simple wiring and the use of minimum size transistor devices in the CAM cell 60 result in a greatly reduced CAM cell size and CAM array area. The reduced dimensions correspondingly reduce the parasitic capacitances of the $\overline{\text{W}}$ and W signal lines 81 and 82 and the DATA and $\overline{\text{DATA}}$ lines 74 and 76. During all operation, interrogation, read and write, one of the access transistors 78 or 80 operates in common source mode. Thus, no threshold voltage drop appears during the access of the CAM cell 60 as otherwise occurs with the conventional cells (e.g. CAM cell 20 of FIG. 1). Because of the common source operation and the reduced parasitic capacitances, the CAM array operates with fast and large signals. The large and fast signals available from memory cell 60 likewise makes it possible to design simple sense amplifiers with increased speed and radiation hardness for a wide variation of operating points. What is even more, the high current drive capability of memory cell 60 permits the logical state of the signals on lines 74 and 76 to be alternated in a small memory matrix without the need for precharge or the time delay inherent therewith. The possibility of designing simple, high performance sense amplifiers further contribute to the reduction in CAM size and to the increase in operational speed.

The insensitivity to changes in transistor device parameters of both CAM cell and sense amplifier increases reliability. Moreover, the combination of the insensitivity to transistor device parameter variation and the high signal operation significantly improves the radiation hardness, noise immunity as well as extends the operation temperature and voltage supply range of the CAM. In addition to having the capability of operating after absorbing a radiation dose of over $10^6$ rad (Si), the sensitivity for impact of alpha or other particles is minimized or may be eliminated, because the data node 73 is clamped to either $V_{DD}$ or $V_{SS}$ through the relatively low on-resistance of transistors 66 or 68. Moreover, the data lines 74 and 76 are charged and discharged by high currents provided by access transistors 78 and 80. What is still more, the floating time of data lines 74 and 76 can be minimized or eliminated by proper timing. What is still more, the reduced parameter and noise sensitivity of memory cell 60 also contributes to a simplification of memory cell fabrication. That is, the reduced parameter sensitivity results in higher parametric yield, while the noise immunity allows for a higher package density, thereby reducing the chip size and, conversely increasing the overall fabrication yield.

Figure 3:
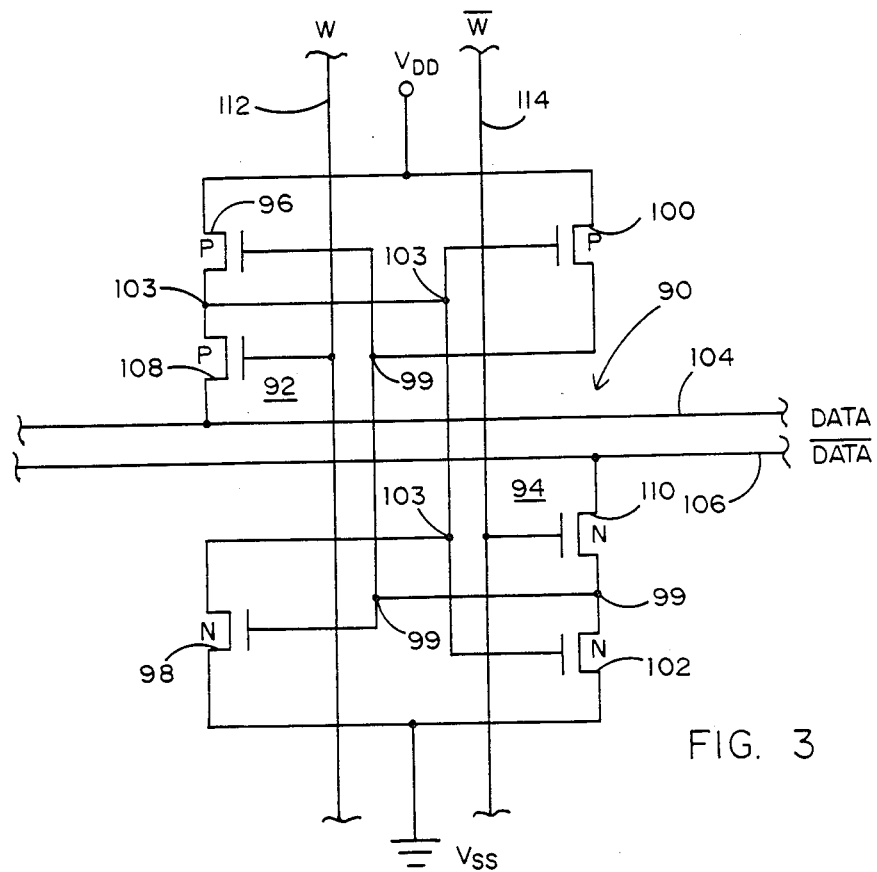

An alternative complementary CAM configuration 90 that is formed from six transistor devices and is interfaced with a pair of data lines is shown in FIG. 3 of the drawings. Memory cell 90 comprises a flip-flop having two cross-coupled inverters 92 and 94 connected in a positive feedback relationship with one another between sources of reference potential $V_{DD}$ and $V_{SS}$. Inverter 92 includes P and N-channel transistors 96 and 98, the control electrodes of which are connected together at a common electrical junction (i.e. a first data node) 99. Inverter 94 includes P and N-channel transistors 100 and 102, the control electrodes of which are connected together at a common electrical junction (i.e. a second data node) 103. Memory cell 90 includes a pair of data lines 104 (designated DATA) and 106 (designated $\overline{\text{DATA}}$) and respective data nodes 99 and 103. Accordingly, a pair of access transistors 108 and 110 are respectively connected between inverters 94 and 92 and data lines 104 and 106, so as to control the read or write access to the data nodes 103 and 99 of memory cell 90.

More particularly, access transistor 108 is a P-channel device having its control electrode connected to a first of a pair of address or word select lines 112 (designated $\overline{W}$). The conduction paths of P-channel transistors 96 and 108 are connected in series between the source of reference potential $V_{DD}$ and data line 104, and one conduction path electrode of each of transistors 96 and 108 is connected together at common electrical junction 103. Access transistor 110 is an N-channel device having its control electrode connected to the second of the pair of word select lines 114 (designated W). The conduction paths of N-channel transistors 102 and 110 are connected in series between data line 106 and the source of reference potential $V_{SS}$, and the conduction path of P-channel transistor 100 is connected between the source of reference potential $V_{DD}$ and common electrical junction 99.

Therefore, and as will be appreciated by those skilled in the art, during the time when data is being written into or read out from memory cell 90, access transistors 108 and 110 are rendered conductive by control signals which are supplied to the control electrodes thereof by way of word select lines 112 and 114. Depending upon the logical state of the data to be written into or read out from memory cell 90, data line 104 will either be interfaced with the source of reference potential $V_{DD}$ (by way of access transistor 108, data node 103, and transistor 96) or the source of reference potential $V_{SS}$ (by way of access transistor 108, data node 103, and transistor 98). Data line 106 will either be interfaced with the source of reference potential $V_{SS}$ (by way of access transistor 110, data node 99, and transistr 102) or the source of reference potential $V_{DD}$ (by way of access transistor 110, data node 99, and transistor 100).

The operation and advantages of the memory cell 90 of FIG. 3 as a CAM storage element are similar to those previously described when referring to the CAM cell 60 of FIG. 2.

Figure 4:
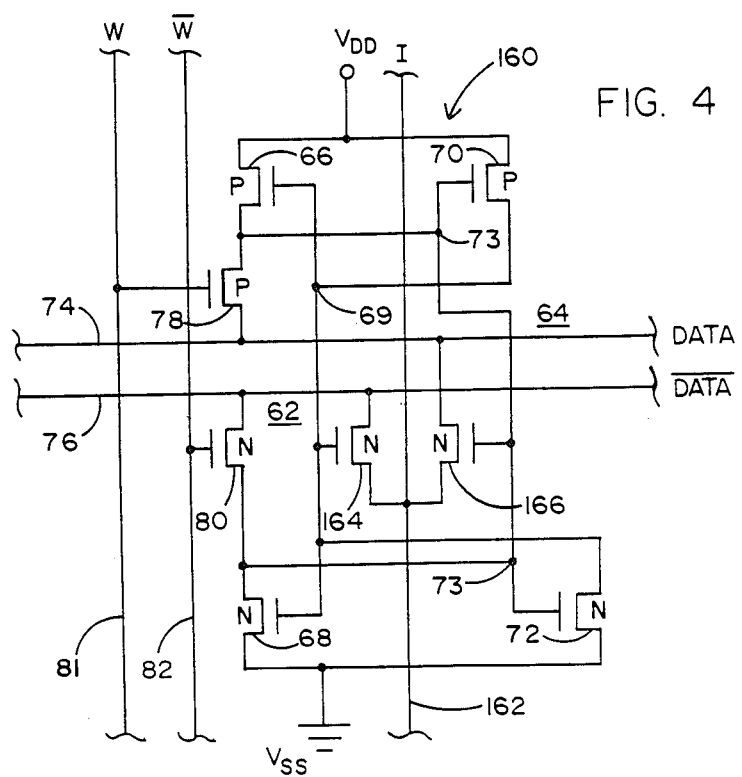

The CAM cell 60 of FIG. 2 may be modified so that another complementary configuration for an improved content addressable memory cell 160 is provided. Such a CAAM cell 160 is fabricated from eight transistor devices (rather than the six transistor devices of CAM cell 60) and is illustrated in FIG. 4 of the drawings. Inasmuch as six of the transistors as well as the signal lines of memory cell 160 are identical to the corresponding transistors and signal lines in the memory cell 60 of FIG. 2, the identical elements of FIG. 4 are provided with like reference numerals and will not, for purposes of convenience, be described again.

However, unlike the memory cell of FIG. 2, memory cell 160 is provided with an interrogation line 162 (designated I) and a pair of identical conductivity-type (e.g. N-channel) coupling transistors 164 and 166, so that the interrogataion line 162 may be separated from the data lines 74 and 76. More particularly, the conduction path of coupling transistor 164 is connected between data line 76 and interrogation line 162. The control electrode of coupling transistor 164 is connected to common electrical junction 69. The conduction path of coupling transistor 166 is connected between data line 74 and interrogation line 162. The control electrode of coupling transistor 166 is connected to common electrical junction 73. Thus, coupling transistor 164 and 166 are interconnected to provide an exclusive NOR function relative to the information at nodes 69 and 73.

In operation, if the interrogation (i.e. associative search) line 162 is precharged to a relatively high potential level, coupling transistors 164 and 166 are selected to be of an N-conductivity type. However, at low-precharge potential levels, P-conductivity type devices are preferred. CAM cell 160 uses a complementary logic level pair (low, high or high, low) on data lines 74 and 76 to be compared with the information at nodes 69 and 73 of the cell during the time that both access transistor 78 and 80 are turned off. When the information on data lines 74 and 76 is matched to the information stored at nodes 69 and 73, the potential on interrogation line 162 will remain at a relatively high level. In case of a mismatch of information, interrogation line 162 will be discharged to a relatively low potential level. Since the word select lines 81 and 82 are used exclusively for selectively addressing, lines 81 and 82 may be arranged in parallel to the interrogation line 162. Therefore, parallel associative search and parallel masked writing can also be accomplished without rotation or multiplexing the data, to provide for increased flexibility in system applications.

In the CAM configuration of FIG. 4, the word select lines 81 and 82 are used during the read/write operation of memory cell 160 (in the same manner as the word select lines 81 and 82 function in the memory cell 60 of FIG. 2), and the interrogation line 162 functions in the traditional manner to determine the content of the stored data. However, by virtue of the configuration of FIG. 4, a CAM cell 160 can be advantageously implemented with only eight transistors, rather than the spacing consuming ten transistors which are needed to implement the prior art CAM cell, such as that illustrated in FIG. 1.

It will be apparent that while a preferred embodiment of the invention has been shown and described, various modifications and changes may be made without departing from the true spirit and scope of the invention. For example, it is to be understood that the memory cells herein disclosed may be fabricated by any process which provides complementary active devices including CMOS-bulk, CMOS-SOS, CMOS, SOI, complementary, bipolar, and complementary junction field effect transistors either on silicon or on gallium arsenide or on other suitable semiconductor material. What is more, the cross-coupled inverters using enhancement P and N-channel MOSFET pairs may be replaced by any type of configuration which is capable of data storage (e.g. cross-coupled inverters using resistor and enhancement, depletion and enhancement, or the same type MOSFET pairs, as well as a single capacitor and other devices which are known to the static and dynamic memory technology arts).

Having thus set forth the preferred embodiment, what is claimed is:

1. A static content addressable memory cell which is interconnected with a plurality of content addressable memory cells by first and second data signal lines which perform the dual functions of interrogating the information content of said cell and inputting and outputting data to and from said cell and by first and second address signal lines which perform the dual functions of transmitting an external search argument which is representative of binary coded information to be compared with the information content of said cell and addressing said memory cell from the plurality of cells, said memory cell being implemented by complementary transistor devices and comprising:

first and second inverter means cross-connected together in a positive feedback relationship between first and second sources of electrical potential;

first and second data storage nodes, a first storage node forming a data input terminal to a first of said inverter means and an output terminal of the second inverter means, and the second data storage node forming a data input terminal to the second inverter means and an output terminal of the first inverter means;

a first access transistor of a first conductivity type having a conduction path connected between a first of said data signal lines and a first of said data storage nodes, and a control electrode connected to a first of said address signal lines, said first access transistor being rendered conductive or non-conductive depending upon the logic level of the signal on said first address signal line; and a second access transistor of a second conductivity type having a conduction path connected between the second of said data signal lines and the same data storage node to which said first access transistor is connected, and a control electrode connected to the second of said address signal lines, said second access transistor being rendered conductive or non-conductive depending upon the logic level of the signal on said second address signal line.

2. The content addressable memory cell recited in claim 1, wherein said cell is implemented by a total of six complementary field effect transistors, three of said transistors being of N-conductivity-type, and three of said transistors being of P-conductivity-type.

3. The content addressable memory cell recited in claim 1, further comprising associative search means to address said cell from said plurality of content addressable memory cells according to the information content thereof, each of said first and second address signal lines providing identical logic level signals which are representative of said external search argument to be compared with the logic level of the data stored at said first storage node, one or the other of said first or second data signal lines conducting current depending upon whether the logic level signal of said address signal lines is either a match or a mismatch relative to the logic level signal at said first storage node.

4. The content addressable memory cell recited in claim 1, wherein identical logic level signals are provided to the conduction paths of said first and second access transistors by way of said first and second data signal lines, and opposing logic level signals are applied at the same time to said first and second address signal lines to thereby render each of said first and second access transistors conductive for writing information into said memory cell.

5. The content addressable memory cell recited in claim 1, wherein said cell is implemented by a total of eight complementary field effect transistors.

6. The content addressable memory cell recited in claim 5, further comprising an interrogation signal line coupled to said data signal lines by a pair of transistor devices and being charged to a first signal level, the conduction paths of said transistor devices connected between said interrogation signal line and respective ones of said data signal lines, and the control electrodes of said transistor devices connected to respective ones of said data storage nodes, said interrogation signal line either remaining at said first signal level or being discharged to a second signal level depending upon the logic levels of the respective signals on said first and second data storage nodes relative to the logic levels of the respective signals on said first and second data signal lines.

7. The content addressable memory cell recited in claim 6, wherein said pair of coupling transistors are of the same conductivity type and are connected in electrical parallel with one another between said interrogation signal lin and said data signal lines to form an exclusive NOR logic gate, said data storage nodes serving as input terminals to said logic gate.

8. A static content addressable memory cell which is interconnected with a plurality of content addressable memory cells by first and second data signal lines which perform the dual functions of interrogating the information content of said cell and inputting and outputting data to and from said cell and by first and second address signal lines which perform the dual functions of transmitting an external search argument to said cell and addressing said memory cell from the plurality thereof, said memory cell being implemented by complementary transistor devices and comprising:

first and second inverter means cross-connected together in a positive feedback relationship between first and second sources of electrical potential;

first and second data storage nodes, a first storage node forming a data input terminal to a first of said inverter means and an output terminal of the second inverter means, and the second data storage node forming a data input terminal to the second inverter means and an output terminal of the first inverter means;

a first access transistor of a first conductivity type having a conduction path connected between a first of said data signal lines and a first of said data storage nodes, and a control electrode connected to a first of said address signal lines, said first access transistor being rendered conductive or non-conductive depending upon the logic level of the signal on said first address signal line; and a second access transistor of a second conductivity type having a conduction path connected between the second of said data signal lines and the second of said data storage nodes, and a control electrode connected to the second of said address signal lines, said second access transistor being rendered conductive or non-conductive depending upon the logic level of the signal on said second address signal line.

9. The content addressable memory cell recited in claim 8, wherein said cell is implemented from a total of six complementary field effect transistors.

* * * * *